US006440647B1

(12) United States Patent
Yakobson

(10) Patent No.: US 6,440,647 B1
(45) Date of Patent: Aug. 27, 2002

(54) RESIST STRIPPING PROCESS

(75) Inventor: Eric Yakobson, Aliso Viejo, CA (US)

(73) Assignee: Alpha Metals, Inc., Jersey City, NJ (US)

( * ) Notice: Subject to any disclaimer, the term of this patent is extended or adjusted under 35 U.S.C. 154(b) by 28 days.

(21) Appl. No.: 09/678,465

(22) Filed: Oct. 3, 2000

Related U.S. Application Data

(63) Continuation-in-part of application No. 09/031,154, filed on Feb. 26, 1998, now abandoned.

(51) Int. Cl.[7] .................................................. G03F 7/42
(52) U.S. Cl. ...................... 430/329; 430/256; 430/258; 430/331; 134/1.3; 510/175; 510/176
(58) Field of Search ................................. 430/256, 258, 430/329, 331; 134/1.3; 510/175, 176

(56) References Cited

U.S. PATENT DOCUMENTS

| | | | |
|---|---|---|---|
| 3,980,587 A | 9/1976 | Sullivan | 252/546 |
| 4,078,102 A | 3/1978 | Bendz et al. | 427/341 |
| 4,239,661 A | 12/1980 | Muraoka et al. | 252/541 |
| 4,776,892 A * | 10/1988 | Sreppan et al. | 134/38 |
| 4,867,799 A | 9/1989 | Grebinski | 134/11 |
| 4,904,571 A | 2/1990 | Miyashita et al. | 430/331 |
| 5,200,031 A * | 4/1993 | Latchford et al. | 156/659.1 |
| 5,407,788 A * | 4/1995 | Fang | 430/318 |
| 5,545,353 A | 8/1996 | Honda et al. | 510/176 |
| 5,759,973 A | 6/1998 | Honda et al. | 510/176 |
| 5,814,588 A | 9/1998 | Cala et al. | 510/175 |
| 5,876,509 A | 3/1999 | Nam | 134/3 |
| 5,902,718 A | 5/1999 | Yamaguchi | 430/331 |
| 6,040,117 A * | 3/2000 | Ota et al. | 430/311 |

FOREIGN PATENT DOCUMENTS

| | | | |
|---|---|---|---|
| DE | 143 920 A | | 10/1985 |
| DE | 41 41 403 A1 | | 6/1993 |
| JP | 1-158444 | | 6/1989 |
| WO | WO 88/05813 | * | 8/1988 |

OTHER PUBLICATIONS

Patent Abstracts of Japan, Publication No. 60203944 (Oct. 15, 1985) (Application No.: 59 060 147); Title: "Method for Removing Positive Type Photoresist".
Bansal et al., Photoresist Stripping Using Ammonium Persulfate in a Spray Machine, Solid State Tech.nology, vol. 26, No. 12 (Dec. 1983) XP002103153.
Derwent Abstract DD 143 920 A (Sep. 17, 1980); Title: "Removing Photoresist Laacquer from Aluminium Substrates—Using Aq. Alkali Silicate Soln. Contg. Ammonia to Prevent Attack of the Metal" (application cited above).
Patent Abstracts of Japan, Publication No. 01 158 444 (Jun. 21, 1989) (Application No.: 63 054 896); Title: "Photoresist Remover"; Applicant: Tokyo Ohka Kogyo Co., Ltd. (application cited above).
Derwent Abstract DE 41 41 403 A (Jun. 17, 1993); Title Rapid Stripping of Light –Crosslinked Photoresist Patterns by Treatment First.

\* cited by examiner

*Primary Examiner*—Mark F. Huff
*Assistant Examiner*—Nicole Barreca
(74) *Attorney, Agent, or Firm*—Mintz, Levin, Cohn, Ferris, Glovsky and Popeo, P.C.

(57) ABSTRACT

A process for removing patterned negative working resist from the surface of a substrate during manufacture of printed wiring boards is disclosed. The process includes the steps of contacting the patterned resist with a stripping solution containing an alkalinity source as well as a source of ammonium ions. The stripping solution is characterized in that it does not contain volatile organic compounds (VOCs).

20 Claims, No Drawings

RESIST STRIPPING PROCESS

This application is a continuation-in-part of U.S. application, Ser. No. 09/031,154, filed Feb. 26, 1998, now abandoned, the entire teachings of which are incorporated herein by reference.

FIELD OF THE INVENTION

The present invention is in the field of printed wiring board fabrication. More specifically, the present invention relates to a process for removing or stripping resist material from the printed wiring board following plating or etching process steps.

BACKGROUND OF THE INVENTION

The majority of printed wiring boards (PWB) that are currently manufactured are made utilizing a combination of subtractive (etching) and additive (plating) techniques. In order to define a conductive pattern on a surface of the PWB, an organic polymer resist layer, typically in the form of a dry film or a liquid, is applied to a copper-clad panel.

In the case in which the resist is of a negative working photo-defined type, the resist-coated panel is exposed to electromagnetic energy, such as visible light or ultraviolet (UV) radiation, which is projected through a pattern. The pattern defines artwork corresponding to a positive or negative image of the metallic traces to be formed on the board. Exposed portions of the negative-type resist undergo a chemical change which allows them to remain on the board. The unexposed portions of the resist are developed off, (i.e., removed). In contrast, in a positive working system, the exposed areas of the resist are rendered soluble in the developing solution. Thus, the soluble areas are removed, leaving the patterned unexposed areas of resist on the board. Alternatively, the resist image may be defined or patterned using a screen printing process. Even less commonly, an electron beam or laser ablation can be used to define a pattern in the resist.

After the resist image has been defined, the PWB surface will be exposed to plating or etching steps depending upon the specific board type and the particular manufacturing technique selected. Following this exposure, it is normally necessary to remove the photopolymer resist layer to allow further processing. The removal step is accomplished using a resist stripping process.

Strongly alkaline ("caustic") solutions are commonly used as resist removers. Among the most commonly used are sodium hydroxide and potassium hydroxide. The most significant drawbacks to the use of caustic solutions are their slow stripping speed, short life and so-called "sheeting". This last effect results because caustic solutions tend to swell most resists, rather than break them up into small particles, and strip them in large sheets. Such sheets are undesirable because they can re-deposit and stick to the copper surface of the board, creating problems in subsequent etching steps. Also, sheets of stripped resist can clog filters and nozzles in spray machines resulting in substantial maintenance problems.

Caustic-based strippers are not commonly used for the "outerlayers" of PWB's where the resist is typically used to define the image for an electroplating step. This is due to the fact that it is virtually impossible to cleanly strip swelled resist between acid copper and tin/tin-lead overplated fine-line traces. In addition, caustic-based strippers tend to attack tin or tin-lead etch resist. Thus, caustic strippers tend to be used for less demanding "innerlayers" or "print & etch" applications, where the resist is simply used to define the pattern for an etching step. Unfortunately, the problems of re-deposition and maintenance described above still remain.

Another known type of stripping composition consists of a mixture of aliphatic or cyclic organic, (i.e., carbon containing), amines, organic quaternary ammonium hydroxides and organic solvents. Sometimes inorganic alkali metal hydroxides are also used as secondary alkalinity carriers. U.S. Pat. No. 5,545,353 describes a photoresist stripper composition containing an organic polar solvent, an alkanolamine and a thiocarboxylic acid as a corrosion inhibitor. U.S. Pat. No. 5,556,482 teaches a method of stripping photoresist with a composition comprising organic polar solvents, basic amines and an inhibitor. U.S. Pat. No. 4,904,571 discloses a method for removing photoresist in solution comprising alcohols, ethers, ketones, chlorinated chlorocarbons, aromatic hydrocarbons, alkali metal hydroxides, carbonates, phosphates, pyrophosphates, borohydrides and organic amine borane compounds.

In most known stripping compositions, the organic part of the stripper, containing amine and a solvent mixture, acts as the primary stripping agent. Such compositions are known to offer high performance, (i.e. high speed), long life and small stripped resist particle size. Unfortunately, the organic part of the stripper composition consists of volatile organic compounds (hereafter VOCs). Due to increasingly stringent government environmental laws and regulations, the printed wiring board industry currently is under heavy pressure to reduce VOC emissions.

VOCs are typically defined as any volatile compound of carbon, (excluding methane, carbon monoxide, carbon dioxide, carbonic acid, metallic carbides or carbonates, ammonium carbonate and exempt compounds), which participates in atmospheric photochemical reactions. VOCs react photochemically in the troposphere with nitrogen oxides ($NO_x$) in the presence of ultraviolet radiation from sunlight and atmospheric oxygen to form ground-level ozone—the primary component of "smog", which is a mixture of $NO_x$, peroxyacyl nitrate ($CH_3COONO_2$), VOCs and ozone. As a result, VOCs are regulated as "ozone precursors".

SUMMARY OF THE INVENTION

The present invention relates to processes for removing or stripping resist material from the printed wiring board following plating or etching process steps. More specifically, the present invention relates to a process for removing negative working resist patterns from a copper-clad printed wiring board (PWB) substrate which comprises the steps of providing a copper-clad PWB substrate having a patterned or layered negative working resist on a surface, providing a VOC-free resist stripping solution which includes a source of an ammonium ion, and exposing the substrate to the stripping solution for a time sufficient to remove all patterned or layered resist from the surface. Surprisingly, ammonium ions have been found to be very effective in stripping negative working resist patterns or layers from copper-clad PWB substrates. Thus, the present invention provides a simple negative working photoresist stripping process that does not use VOCs, and as such, the invention eliminates a significant source of environmental contamination.

DETAILED DESCRIPTION

One of the steps of the PWB manufacturing process that is being targeted for VOC emission reduction, and eventual elimination, is resist stripping. Surprisingly, it has been found that the organic mixture of amines, solvents and quaternary ammonium compounds commonly present in known resist stripping compositions can be successfully replaced by an inorganic non-VOC-containing solution containing a source of ammonium ions, such as ammonia gas or ammonium hydroxide. Ammonia-based compounds are already used in the PWB industry, and ammonium hydroxide is used extensively in ammoniacal etchants for various copper etching processes. As discussed above, the etching step is a step just preceding resist stripping in innerlayer production or subsequent to resist stripping in outerlayer manufacturing.

Ammonia is very soluble in aqueous solutions and once dissolved, depending on pH, it can react with hydrogen (hydronium) ions to form ammonium ions. This reaction occurs if hydrogen ions are readily available, such as at low pH. In alkaline solution, where hydrogen ions are not readily available, the ammonia remains in its gaseous form. At a pH of greater than about 9.3 (at 25° C.), 50% of ammonia is in the form of the ammonium ion, whereas at a pH of about 12, almost 100% of ammonia remains in gaseous form. At elevated temperatures, the equilibrium is shifted further toward gas.

Conventional resist strippers are normally used under conditions at which the pH is greater than about 11 and the temperature is in the range of about 120–130° F. (about 49–54° C.). At these conditions, virtually all of the ammonia would stay in gaseous form and volatilize in a matter of hours. As such, ammonia gas was never commercially utilized as a primary resist stripping agent. Although U.S. Pat. No, 3,980,587 discloses a method for stripping certain resists using a solution containing 10 to 30 lb per gallon (about 1.2–3.6 kg/l) of a concentrate containing ethylene glycol monobutyl ether as a primary resist stripping agent (50–55% by weight), EDTA salt, acetic acid and an alkaline stripper component (19% by weight) containing a 30:1 mixture of potassium hydroxide and ammonium hydroxide, ammonium hydroxide at this negligible concentration would not contribute appreciably to the stripping action of the organic stripping agent (ethylene glycol monobutyl ether) and the alkalinity carrier (potassium hydroxide).

Likewise, U.S. Pat. No. 4,078,102 describes a process for stripping resist in a mixture of an aldehyde or a ketone as primary resist stripper agent and an activator, containing an alcoholic solution of ammonium, alkali and alkali earth metal hydroxides in proportion of 0.005 to 0.1 mole activator to 1 mole of aldehyde or ketone. In a more preferred embodiments, the patent suggests a saturated isopropyl alcohol solution of sodium hydroxide (alkalinity carrier) and cyclohexanone (primary resist stripper) in proportion 0.006–0.01 to 1. Once again the stripping action of this composition can be attributed to the organic part of the stripper rather than to the inorganic alkalinity carrier.

The concept behind current invention is to provide a fully aqueous VOC-free resist stripping process utilizing ammonia gas or other source of ammonium ions as a primary negative working resist stripping agent without utilizing any volatile organic materials. The invention also relates to a method to maintain constant and sufficiently high ammonium ion concentration in alkaline solutions (pH>9) at elevated temperatures, (i.e., 80–140° F.). Optional bath components include non-volatile inhibitors to prevent corrosion of metal surfaces exposed to the stripping solution, and antifoaming or defoaming agents to control foam generation if the solution is subjected to high agitation to enhance the stripping action.

In order to prolong the life of stripping solutions, most modern resist stripper systems normally operate in so-called "feed and bleed" mode. In this mode, a portion if the stripping bath is continuously removed and the bath is continuously replenished with fresh stripper solution. Under these conditions ammonium ion concentration can be easily maintained at a constant level by utilizing any of the following methods:

a) continuously feeding an ammonium hydroxide solution into the stripper solution;

b) continuously feeding an alkaline ammonium salt (carbonate, carbamate, silicate, formate, phosphate, sulfite, etc.), which will convert into ammonium gas at pH>12 and 120–130° F.;

c) continuously injecting compressed ammonia gas directly into the stripping solution;

d) withdrawing and recovering ammonia gas from ammonia-rich ammoniacal etchant vapor and continuously injecting it into the stripping solution, thereby recycling it.

The stripping solution can be applied to the developed photoresist using any of a wide variety of methods known in the art. For example, the board containing the developed photoresist may simply be immersed into a bath of the stripping solution. Alternatively, the stripping solution may be sprayed onto the board. It is noted that the methods described herein to apply the stripping solution to the developed photoresist are not intended to limit the invention in any way.

It should further be recognized that the source of the ammonium ions is not intended to be limited to those species described above, but rather may be any ammonium ion source that can be used without introducing VOCs into the process. Likewise, it should be apparent that it is desirable to maintain the stripping solution at a caustic pH, both for the stripping ability of the caustic and for the ability of the caustic solution to convert ammonium ions into a source of ammonia gas. Although several compounds are described above for providing and/or maintaining the caustic nature of the stripping bath, it is to be understood that the invention is not intended to be limited strictly to those compounds. Rather, virtually any source of alkalinity can be used provided that it does not introduce VOCs into the process.

EXPERIMENTAL

EXAMPLE 1

A copper-clad panel was hot-roll laminated using DuPont Riston 9020 negative working dry film photoresist, exposed and developed in 1% sodium carbonate solution. A resist stripping solution containing 20 grams per liter of potassium hydroxide and 10 mililiters per liter of ammonium hydroxide (30% aqueous solution) was provided. The stripping solution was heated to about 125° F. (about 51.7° C.) and the panel was immersed into the solution. In less than 60 seconds, all the resist was completely removed from the surface of the panel.

EXAMPLE 2

A copper-clad panel was hot-roll laminated using Dynachem Laminar GA negative working dry film photoresist, exposed and developed in 1% sodium carbonate solution. A resist stripping solution containing 50 grams per liter of sodium hydroxide and 20 grams per liter of ammonium bicarbonate was provided. The stripping solution was heated to about 130° F. (about 54.4° C.) and the panel was immersed into the solution. In less than 60 seconds, all the resist was completely removed from the surface of the panel.

EXAMPLE 3

A copper-clad panel was hot-roll laminated using DuPont Riston 9015 negative working dry film photoresist, exposed and developed in 1% sodium carbonate solution. A resist stripping solution containing 25 grams per liter of lithium hydroxide and 15 grams per liter of ammonium carbamate was provided. The stripping solution was heated to about 120° F. (about 48.9° C.) and the panel was immersed into the solution. In less than 60 seconds, all the resist was completely removed from the surface of the panel.

EXAMPLE 4

Three copper-clad panels were hot-roll laminated using DuPont Riston 9020 negative working dry film photoresist, exposed and developed in 1% sodium carbonate solution. The stripping solution from example 1 was heated to about 125° F. (about 51.7° C.) and the first panel was immersed into the solution. In less than 60 seconds, all the resist was completely removed from the surface of the panel. The solution was stirred at about 125° F. (about 51.7° C.) for 2 hours to volatilize ammonia. The second panel was immersed into the solution. After 60 seconds, the resist was not completely removed from the surface of the second panel. Ten mililiters of 30% ammonium hydroxide were added to the stripping solution, and the third panel was immersed into the solution. In less than 60 seconds, all the resist was completely removed from the surface of the third panel.

COMPARATIVE EXAMPLE 1

A copper-clad panel was hot-roll laminated using DuPont Riston 9020 negative working dry film photoresist, exposed and developed in 1% sodium carbonate solution. A resist stripping solution containing 20 grams per liter of potassium hydroxide was provided. The stripping solution was heated to about 125° F. (about 51.7° C.) and the panel was immersed into the solution. After 60 seconds, the resist was not removed from the surface of the panel.

COMPARATIVE EXAMPLE 2

A copper-clad panel was hot-roll laminated using DuPont Riston 9020 negative working dry film photoresist, exposed and developed in 1% sodium carbonate solution. A resist stripping solution containing PC-4077 Resist Stripper (available from Alpha Metals PC Fab Division) 10% (by vol.) was provided. The stripping solution was heated to about 125° F. (about 51.7° C.) and the panel was immersed into the solution. After 60 seconds, the resist was completely removed from the surface of the panel.

EQUIVALENTS

From the foregoing detailed description of the specific embodiments of the invention, it should be apparent that a unique resist stripping process has been described. Although particular embodiments have been disclosed herein in detail, this has been done by way of example for purposes of illustration only, and is not intended to be limiting with respect to the scope of the appended claims that follow. In particular, it is contemplated by the inventor that various substitutions, alterations, and modifications may be made to the invention without departing from the spirit and scope of the invention as defined by the claims.

What is claimed is:

1. A process for removing patterned negative working resist from a copper-clad printed wiring board substrate which comprises the steps of:
    a) providing a copper-clad printed wiring board substrate having a negative working patterned resist on a surface;
    b) providing an aqueous VOC-free resist stripping solution which includes a source of an ammonium ion; and
    c) exposing the copper-clad printed wiring board substrate to the stripping solution for a time sufficient to remove all patterned negative working resist from the surface.

2. A process as in claim 1, wherein the VOC-free resist stripping solution further includes a source of hydroxide ions.

3. A process as in claim 2 wherein the source of hydroxide ions is selected from the group consisting of potassium hydroxide, sodium hydroxide, lithium hydroxide and combinations thereof.

4. A process as in claim 1 wherein the source of the ammonium ion comprises ammonia gas.

5. A process as in claim 1 wherein the source of the ammonium ion comprises ammonium hydroxide.

6. A process as in claim 1 wherein the source of the ammonium ion comprises an ammonium salt.

7. A process as in claim 1 wherein the ammonium salt is selected from the group consisting of ammonium carbonates, ammonium carbamate, ammonium sulfites, ammonium silicates, ammonium formates, ammonium phosphates, and combinations thereof.

8. A process as in claim 1 wherein the VOC-free resist stripping solution further includes a non-volatile corrosion inhibitor.

9. A process as in claim 1 wherein the VOC-free resist stripping solution further includes an antifoaming agent.

10. A process as in claim 1 wherein the VOC-free resist stripping solution further includes a defoaming agent.

11. A process as in claim 1 wherein the exposing step comprises immersing the substrate in the stripping solution.

12. A process as in claim 1 wherein the exposing step comprises spraying the stripping solution onto the substrate.

13. A process as in claim 1 wherein the source of the ammonium ion in the stripping solution is periodically or continuously replenished.

14. A process as in claim 13 wherein the replenishment comprises periodically or continuously adding an ammonium hydroxide solution to the stripper solution.

15. A process as in claim 13 wherein the replenishment comprises periodically or continuously adding an alkaline ammonium salt to the stripper solution.

16. A process as in claim 13 wherein the replenishment comprises periodically or continuously adding ammonia gas to the stripper solution.

17. A process as in claim 1 wherein the pH of the stripping solution is maintained at or above about 9.3.

18. A process as in claim 1 wherein the pH of the stripping solution is maintained at or above about 11.0.

19. A process as in claim 1 wherein the pH of the stripping solution is maintained at or above about 12.0.

20. A process as in claim 1 wherein the removal is carried out at a temperature in the range of about 80° F. to about 140° F.

* * * * *